United States Patent
Park et al.

(10) Patent No.: US 7,286,022 B2
(45) Date of Patent: Oct. 23, 2007

(54) RESISTOR-CAPACITOR (RC) OSCILLATOR INSENSITIVE TO PROCESS, VOLTAGE, AND TEMPERATURE VARIANCES

(75) Inventors: Chang-Hyon Park, Yongin-si (KR); Hong-Keun Yune, Seoul (KR)

(73) Assignee: Samsung Electronics Co., Ltd. (KR)

( * ) Notice: Subject to any disclaimer, the term of this patent is extended or adjusted under 35 U.S.C. 154(b) by 79 days.

(21) Appl. No.: 11/352,020

(22) Filed: Feb. 11, 2006

(65) Prior Publication Data

US 2006/0181359 A1    Aug. 17, 2006

(30) Foreign Application Priority Data

Feb. 15, 2005    (KR) ...................... 10-2005-0012443

(51) Int. Cl.
   *H03B 5/20*    (2006.01)
(52) U.S. Cl. .................................. 331/135; 331/108 B
(58) Field of Classification Search ................ 331/135, 331/108 B
   See application file for complete search history.

(56) References Cited

U.S. PATENT DOCUMENTS

| 4,272,736 | A | * | 6/1981 | Gercekci et al. ........ 331/108 B |
| 5,180,991 | A | * | 1/1993 | Takashima .................. 331/1 A |
| 5,414,392 | A | * | 5/1995 | Schupak ...................... 332/118 |
| 6,462,625 | B2 | * | 10/2002 | Kim ............................. 331/57 |
| 6,686,806 | B2 | * | 2/2004 | Dufour ......................... 331/57 |
| 6,825,735 | B2 | * | 11/2004 | Chung ......................... 331/135 |
| 6,894,574 | B2 | * | 5/2005 | Nagatomo ................... 331/135 |
| 7,129,798 | B2 | * | 10/2006 | Aoyama et al. ............ 331/135 |

FOREIGN PATENT DOCUMENTS

| JP | 06-104639 | 4/1994 |
| JP | 08-065043 | 3/1996 |
| KR | 10-2004-0017156 | 2/2004 |

* cited by examiner

*Primary Examiner*—Joseph Chang
(74) *Attorney, Agent, or Firm*—F. Chau & Assoc., LLC

(57) ABSTRACT

There is provided a resistor-capacitor (RC) oscillator circuit insensitive to process, voltage, and temperature variances. The RC oscillator circuit includes a delay unit, a resistor unit, a capacitor, a resistor, and a first controller. The delay unit delays and outputs a signal received through an input terminal. The resistor unit is connected between an input terminal of the delay unit and a first node. The capacitor is connected between an output terminal of the delay unit and the first node. The resistor is connected between the input terminal of the delay unit and an output node. The first controller is connected between the output terminal of the delay unit and the output node, wherein a frequency signal is output through the output node.

24 Claims, 3 Drawing Sheets

RESISTOR-CAPACITOR (RC) OSCILLATOR INSENSITIVE TO PROCESS, VOLTAGE, AND TEMPERATURE VARIANCES

CROSS-REFERENCE TO RELATED APPLICATIONS

This application claims priority to Korean Patent Application No. 10-2005-0012443, filed on Feb. 15, 2005, the disclosure of which is herein incorporated by reference in its entirety.

BACKGROUND OF THE INVENTION

1. Technical Field

The present invention relates to an oscillator circuit for generating a frequency signal and, more particularly, to a resistor-capacitor (RC) oscillator circuit using a resistor and a capacitor for generating a frequency signal.

2. Description of the Related Art

In general, oscillators display some degree of frequency variation with temperature. As with variations in temperature, oscillators may exhibit sensitivity to operating voltage. A typical RC oscillator circuit includes a plurality of inverters serially connected, a capacitor, and a resistor. The typical RC oscillator circuit generates a frequency signal having a specific frequency using an RC time constant of the capacitor and the resistor.

FIG. 1 is a circuit diagram of a conventional resistor-capacitor (RC) oscillator circuit 100. Referring to FIG. 1, the RC oscillator circuit 100 includes inverters 107, 110, 120, 130, 170, and 180, a capacitor 140 connected between nodes N_C1 and N_C2, a transistor 105 responding to an input signal IN, and a NAND device 160.

For the purposes of this description, it is assumed that a threshold voltage (switching point) of a first inverter 110 is VDD/2, where VDD is a supply voltage, and that the propagation delay time of each inverter in the RC oscillator circuit 100 is much smaller than the RC decay time constant. In the conventional RC oscillator circuit 100 shown in FIG. 1, if an input signal IN transits to high, the transistor 105 is turned off and the RC oscillator circuit 100 is enabled.

If the voltage at the node N_C1 rises from 0 V to VDD/2, the voltage at the node N_C2 rises to a supply voltage VDD after a predetermined time delay (propagation delay) by the first and second inverters 110 and 120. For example, the voltage at the node N_C1 may rise from VDD/2 to 3*VDD/2 by charge maintenance of the capacitor 140.

Since the third inverter 130 inverts and outputs the voltage of the node N_C2, a voltage of 0 V is applied to the node N_C1 by the NAND device 160 and the inverter 170. Thus, the voltage at the node N_C1 falls from 3*VDD/2 to VDD/2, which is the threshold voltage of the first inverter 110, according to the slope of the RC time constant of the resistor 150 and the capacitor 140. At that time, a frequency signal FOUT, which is output through the output node NOUT, is maintained at 0 V during a half period of the frequency signal FOUT.

However, the frequency of a frequency signal output from the RC oscillator circuit 100 of FIG. 1 may decrease at a low temperature and low supply voltage and increase at a high temperature and high supply voltage. Also, the frequency of the frequency signal output from the RC oscillator circuit 100 may increase or decrease when the current driving ability increases or decreases, for example, due to process variance.

As described above, the RC oscillator circuit 100 of FIG. 1 may exhibit sensitivity to process, voltage, and temperature variances. For example, the RC oscillator circuit 100 may exhibit frequency variation of 10% to 20% depending on process type, 20% to 30% depending on temperature (e.g., −40° to 80° C.), and 20% to 30% depending on voltage (e.g., 1.6 V to 2.0 V).

SUMMARY OF THE INVENTION

Exemplary embodiments of the present invention provide a resistor-capacitor (RC) oscillator circuit for generating a frequency signal.

According to an exemplary embodiment of the present invention, a resistor-capacitor (RC) oscillator circuit includes: a delay unit delaying and outputting a signal received through an input terminal; a resistor unit connected between an input terminal of the delay unit and a first node; a capacitor connected between an output terminal of the delay unit and the first node; a resistor connected to the input terminal of the delay unit and an output node; and a first controller connected between the output terminal of the delay unit and the output node, wherein a frequency signal is output through the output node.

The delay unit includes first and second inverters serially connected and wherein a threshold voltage the first inverter is about 1/2 of a supply voltage. Propagation delay times of the first and second inverters are smaller than an RC time constant of the resistor and the capacitor.

Resistance of the resistor unit is inversely proportional to a voltage applied between the input terminal and the first node. Resistance of the resistor unit is inversely proportional to a temperature of the resistor unit. A frequency of the frequency signal is proportional to the resistance of the resistor unit.

The resistor unit is a transmission gate which is always in a turned-on state. A frequency of the frequency signal varies in response to a change in capacitance of the capacitor.

A frequency of the frequency signal varies in response to a change in resistance of the resistor. The RC oscillator circuit may further include a fuse circuit disposed between the resistor unit and the capacitor.

According to another exemplary embodiment of the present invention, a resistor-capacitor (RC) oscillator circuit includes: a delay unit delaying and outputting a signal received through an input terminal; a plurality of resistor units respectively connected in parallel between an input terminal of the delay unit and a plurality of corresponding first nodes; capacitors respectively connected in parallel between an output terminal of the delay unit and the corresponding first nodes; a resistor connected between the input terminal of the delay unit and an output node; and a first controller connected between the output terminal of the delay unit and the output node, wherein a frequency signal is output through the output node.

The first controller includes: a third inverter connected to the output terminal of the delay unit; a NAND device performing a NAND operation of an output of the third inverter and a delay signal having a predetermined delay time; and a fourth inverter inverting and outputting an output of the NAND device as the frequency signal.

According to an exemplary embodiment of the present invention, the RC oscillator circuit further includes: a fifth inverter inverting and outputting an input signal; a transistor having a first terminal connected to the input terminal of the delay unit, a second terminal connected to a ground voltage, and a gate receiving an output of the fifth inverter; and a sixth inverter inverting and outputting the output of the fifth inverter as the delay signal.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
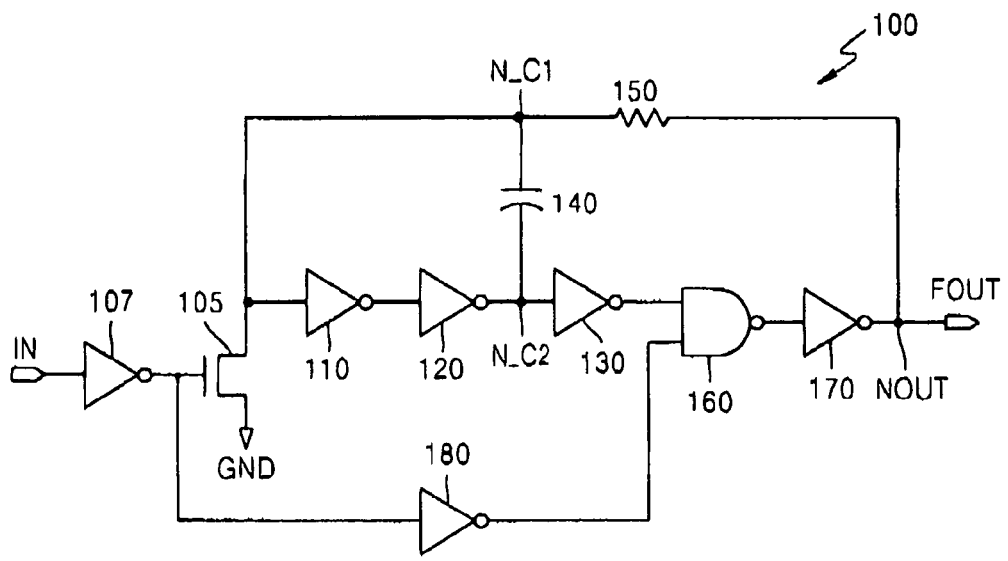
FIG. 1 is a circuit diagram of a conventional resistor-capacitor (RC) oscillator circuit.

Hereinafter, the exemplary embodiments of the present invention will be described in detail with reference to the accompanying drawings. Like reference numerals refer to similar or identical elements throughout the description of the figures.

Figure 2:
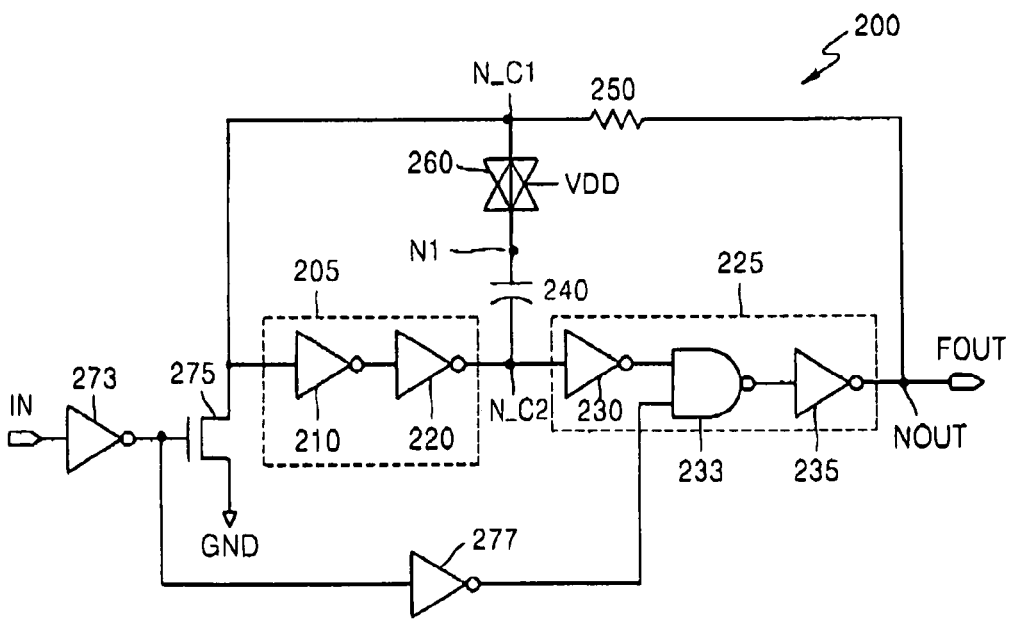
FIG. 2 is a circuit diagram of an RC oscillator circuit according to an exemplary embodiment of the present invention.

FIG. 2 is a circuit diagram of a resistor-capacitor (RC) oscillator circuit 200 according to an exemplary embodiment of the present invention. Referring to FIG. 2, the RC oscillator circuit 200 includes a delay unit 205, a resistor unit 260, a capacitor 240, a resistor 250, and a first controller 225.

The delay unit 205 delays and outputs a signal (not shown) received through an input terminal N_C1. The resistor unit 260 is connected between the input terminal N_C1 of the delay unit 205 and a first node N1. The capacitor 240 is connected between an output terminal N_C2 of the delay unit 205 and the first node N1. The resistor 250 is connected between the input terminal N_C1 of the delay unit 205 and an output node NOUT.

The first controller 225 includes a third inverter 230 connected to the output terminal N_C2 of the delay unit 205, a NAND device 233 for performing a NAND operation of an output of the third inverter 230 and a delay signal DS having a predetermined delay time, and a fourth inverter 235 for inverting and outputting an output of the NAND device 233 as a frequency signal FOUT.

The frequency signal FOUT is output through the output node NOUT. The delay unit 205 includes first and second inverters 210 and 220, which are serially connected.

The RC oscillator circuit 200, according to an exemplary embodiment of the present invention, further includes: a fifth inverter 273 for inverting and outputting an input signal IN; a transistor 275 having a first terminal connected to the input terminal N_C1 of the delay unit 205, a second terminal connected to a ground voltage GND, and a gate receiving the outputs of the fifth inverter 273; and a sixth inverter 277 for inverting and outputting the output of the fifth inverter 273 as a delay signal DS.

The process in which a frequency is decided by the RC oscillator circuit 200 will be described below.

For the purposes of this description, in the interests of clarity and simplicity, it is assumed that the threshold voltage (switching point) of the first inverter 230 is VDD/2 (where VDD is a supply voltage) and that the propagation delay time of each of the inverters 210, 220, 230, and 235 is smaller than the RC time constant of the resistor 250 and the capacitor 240.

In accordance with an exemplary embodiment of the present invention, the RC oscillator circuit 200 includes a resistor 260 connected to the node N_C1, wherein the resistor 260 is a transmission gate that is always in a turned-on state.

In the oscillator circuit 200 shown in FIG. 2, there is a period in which the turn-on resistance of the transmission gate 260 sharply increases as its gate-source voltage falls to a threshold voltage, while the voltage at the input terminal N_C1 of the delay unit 205 falls from 3/2*VDD to 1/2*VDD. During that period, the voltage at the input terminal N_C1 is quickly discharged to the switching point (threshold voltage) of the inverter 230. The turn-on resistance of the transmission gate 260 can be expressed by Equation 1.

$$R_{on} = \{1/K_n*[V_{gs}-V_{thn}]\}//\{1/K_p*[V_{sg}-|V_{thp}|]\}, \quad \text{[Equation 1]}$$

where, $K_n$ and $K_p$, respectively, represent mobilities of carriers in a NMOS transistor (not shown) and a PMOS transistor (not shown) comprising the transmission gate 260; $V_{thn}$ is the threshold voltage of the NMOS transistor; $V_{thp}$ is the threshold voltage of the PMOS transistor; and $V_{gs}$ and $V_{sg}$, respectively, are the voltages between the gate and source of the NMOS transistor and between the gate and source of the PMOS transistor.

As shown in Equation 1, turn-on resistance is inversely proportional to the gate-source voltages $V_{gs}$ and $V_{sg}$ of the transistors in a transmission gate and to mobilities $K_p$ and $K_n$ of carriers. Turn-on resistance is inversely proportional to temperature and voltage.

In the RC oscillator circuit 200, the transmission gate 260, which is always in a turned-on state, is connected between the input terminal N_C1 of the delay unit 205 and the capacitor 340. The voltage at the input terminal N_C1 exceeds the threshold voltage of the first inverter 210 during the period in which the turn-on resistance sharply increases, and thus the output of the second inverter 220 rises from 0 V to the supply voltage VDD.

Since the amount of charge stored in the capacitor 240 is maintained constant, the voltage at the first node N1 shown in FIG. 2 between the transmission gate 260 and the capacitor 240 rises to 3/2*VDD, and the voltage at the input terminal N_C1 also rises to 3/2*VDD since it is connected to the first node N1 through the transmission gate 260 that is always in a turned-on state.

The output of the delay unit 205 becomes 0 V via the first controller 225. The charges on the input terminal N_C1 flow to the ground GND according to the RC time constant of the resistor 250 and the capacitor 240.

While the charges on the input terminal N_C1 flow to the ground GND, as the gate-source voltage of the transmission gate 260 approaches the threshold voltage, there is a period in which the turn-on resistance of the transmission gate 260 sharply increases, as shown in the Equation 1. During that period, the voltage at the input terminal N_C1 quickly falls by the resistor 250.

The voltage at the input terminal N_C1 of FIG. 2 reaches the threshold voltage more quickly than in the case of the conventional oscillator circuit 100 of FIG. 1. The output of the second inverter 220 falls from the supply voltage VDD to 0 V, and the voltage at the first node N1 shown in FIG. 2 between the transmission gate 260 and the capacitor 240 also falls to −1/2*VDD by the charging of the capacitor 240.

In the RC oscillator circuit 200 according to an exemplary embodiment of the present invention, the pulse width of an output frequency signal FOUT is smaller than that of the conventional oscillator circuit, and the transmission gate 260, which is always in a turned-on state according to an exemplary embodiment of the present invention, increases the frequency of the frequency signal FOUT.

In the conventional RC oscillator circuit 100, a decrease in temperature or voltage causes a decrease in the frequency. However, in the oscillator circuit 200 according to the exemplary embodiments of the present invention, a decrease in temperature or voltage causes an increase in the resistance of the transmission gate 260, which increases the frequency of the frequency signal FOUT.

In the conventional RC oscillator circuit 100, an increase in temperature or voltage causes an increase in frequency. In the RC oscillator circuit 200 according to an exemplary embodiment of the present invention, an increase in temperature or voltage causes a decrease in the resistance of the transmission gate 260, which decreases the frequency of the frequency signal FOUT.

According to an exemplary embodiment of the present invention, the frequency of the frequency signal FOUT can be set to a desired frequency through adjustment of the resistance of the transmission gate 260.

If the frequency of the frequency signal FOUT of the oscillator circuit 200 is set to a desired frequency, the voltage of the input terminal N_C1 falls more slowly, since the turn-on resistance of the transmission gate 260 decreases in response to increase in temperature or supply voltage, as shown in Equation 1.

The half period of the frequency signal FOUT increases, and the frequency of the frequency signal FOUT becomes lower than the desired frequency.

The oscillator circuit 200 according to exemplary embodiments of the present invention can generate an appropriate frequency signal FOUT insensitive to changes in temperature or voltage. For example, the oscillator circuit 200 can generate a frequency signal FOUT insensitive to changes in temperature or supply voltage by adjusting a pulse width determining the half period of the frequency signal FOUT.

Figure 3:
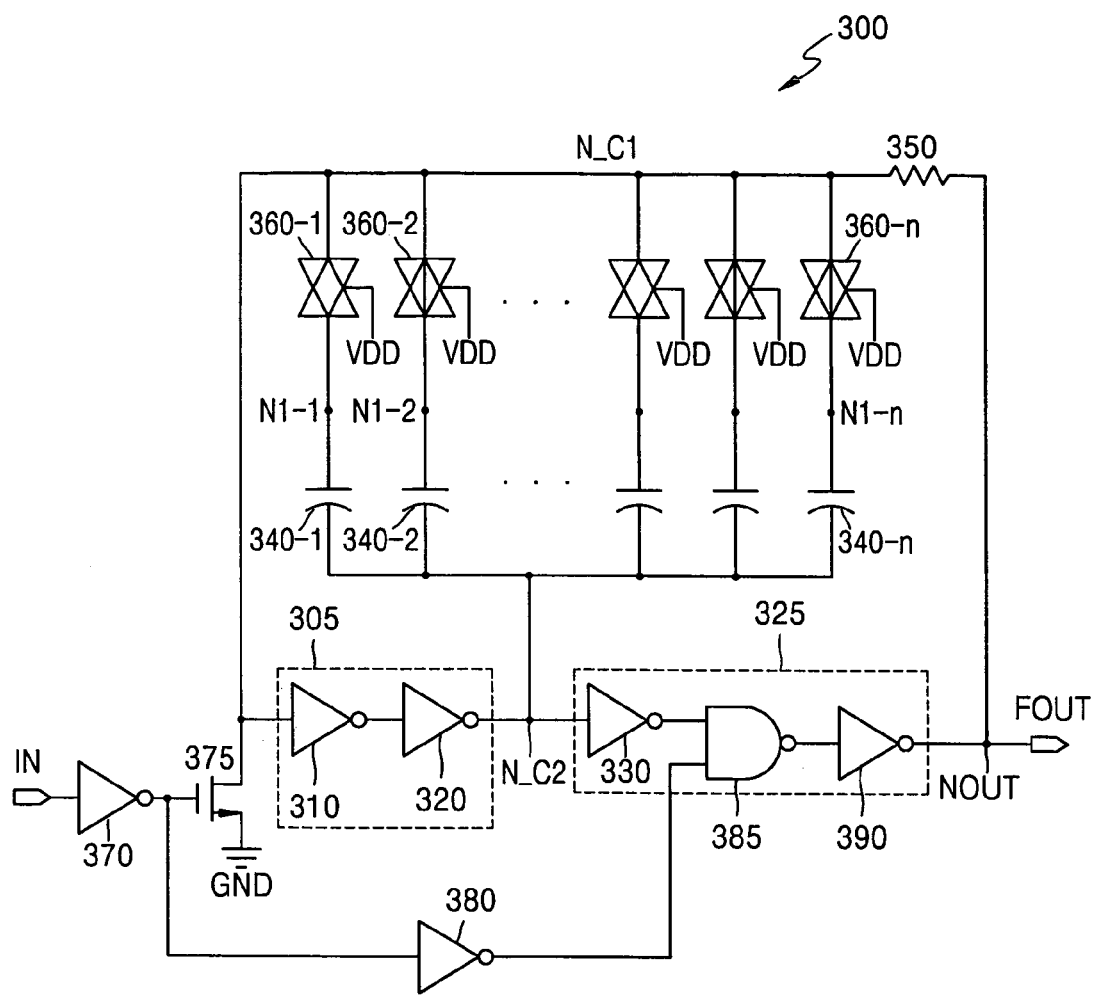
FIG. 3 is a circuit diagram of an RC oscillator circuit according to another exemplary embodiment of the present invention.

FIG. 3 is a circuit diagram of an RC oscillator circuit 300 according to another exemplary embodiment of the present invention. Referring to FIG. 3, the RC oscillator circuit 300 includes a delay unit 305, a plurality of resistors 360-1 through 360-n, capacitors 340-1 through 340-n, a resistor 350, and a first controller 325.

The delay unit 305 delays and outputs a signal (not shown) received through an input terminal N_C1. The plurality of resistors 360-1 through 360-n are respectively connected in parallel between an input terminal N_C1 of the delay unit 305 and a plurality of corresponding first nodes N1-1 through N1-n. The capacitors 340-1 through 340-n are respectively connected in parallel between an output terminal N_C2 of the delay unit 305 and the corresponding first nodes N1-1 through N1-n.

The resistor 350 is connected between the input terminal N_C1 of the delay unit 305 and an output node NOUT. The first controller 325 is connected between the output terminal N_C2 of the delay unit 305 and the output node NOUT. The frequency signal FOUT is output through the output node NOUT.

The first controller 325 includes a third inverter 330 connected to the output terminal N_C2 of the delay unit 305, a NAND device 385 for performing a NAND operation of the output of the third inverter 330 and a delay signal DS having a predetermined delay time, and a fourth inverter 390 for inverting and outputting the output of the NAND device 385 as a frequency signal FOUT.

The RC oscillator circuit 300 may further include: a fifth inverter 370 for inverting and outputting an input signal IN: a transistor 375 having a first terminal connected to the input terminal N_C1 of the delay unit 305, a second terminal connected to a ground GND, and a gate receiving the output of the fifth inverter 370; and a sixth inverter 380 for inverting and outputting the output of the transistor 375 and the fifth inverter 370 as a delay signal DS.

The delay unit 305 includes first and second inverters 310 and 320 serially connected. In an exemplary embodiment of the present invention, the threshold voltage of the first inverter 310 is about 1/2 of a supply voltage. In an exemplary embodiment of the present invention, the plurality of resistors 360-1 through 360-n are transmission gates that are always in a turned-on state.

The oscillator circuit 300 shown in FIG. 3 has the same configuration as the oscillator circuit 200 shown in FIG. 2, except that the plurality of resistors 360-1 through 360-n and the plurality of capacitors 340-1 through 340-n are connected between the input terminal N_C1 and the output terminal N_C2 of the delay unit 305.

By appropriately adjusting the capacitances of the plurality of capacitors 340-1 through 340-n, it is possible to control a pulse width of a clock pulse representing the half period of a frequency signal FOUT output through the output node NOUT.

If the voltage at the input terminal N_C2 exceeds the switching point (threshold voltage) of the first inverter 310, the output of the second inverter 320 rises from 0 V to the supply voltage VDD. Since the amount of charge stored in the capacitors 340-1 through 340-n is maintained constant, the voltage at the first nodes N1-1 through N1-n rises to 3/2*VDD, and the voltage at the input terminal N_C1 also rises to 3/2*VDD since it is connected to the first nodes N1-1 through N1-n through the transmission gates 360-1 through 360-n that are always in a turned-on state.

Thus, the output of the fourth inverter 390, which operates in response to a signal received via the first inverter 310, the second inverter 320, the third inverter 330, and the NAND device 385, becomes 0 V, and the charges of the input terminal N_C1 flow to a ground GND according to the slope of the RC time constant of the resistor 350 and the capacitors 340-1 through 340-n.

While the charge on the input terminal N_C1 flow to the ground GND, there is a period in which the turn-on resistance of the transmission gate sharply increases. During that period, the voltage at the input terminal N_C1 quickly falls to 0 V by the resistor 350.

The voltage at the input terminal N_C1 of FIG. 3 reaches the threshold voltage of the first inverter 310 more quickly than in the case of the conventional oscillator circuit 100 of FIG. 1. The output voltage of the second inverter 320 falls from the supply voltage VDD to 0 V, and the voltages of the first nodes N1-1 through N1-n shown in FIG. 3 between the transmission gates 360-1 through 360-n and the capacitors 340-1 through 340-n also fall to −1/2*VDD by the charging of the capacitors 340-1 through 340-n.

In the oscillator circuit 300 of FIG. 3, the period of the frequency signal FOUT becomes smaller than that of the conventional oscillator circuit 100, and the transmission gates increase the frequency of the frequency signal FOUT.

The addition of the resistors 360-1 through 360-n (or transmission gates) between the input terminal N_C1 and the output terminal N_C2 of the oscillator circuit 300, increases the frequency of the frequency signal FOUT.

Since the turn-on resistance of transmission gates increases when the current driving capability decreases, a low temperature or a low voltage decreases the half period of the frequency signal FOUT output from the RC oscillator circuit 300. The frequency of the frequency signal FOUT should be set to a large value under the above condition.

On the other hand, since the turn-on resistance of transmission gates decreases when the current driving capability increases, a high temperature or a high voltage increases the half period of the frequency signal FOUT output from the RC oscillator circuit. The frequency of the frequency signal FOUT should be set to a small value under the above condition.

Figure 4:
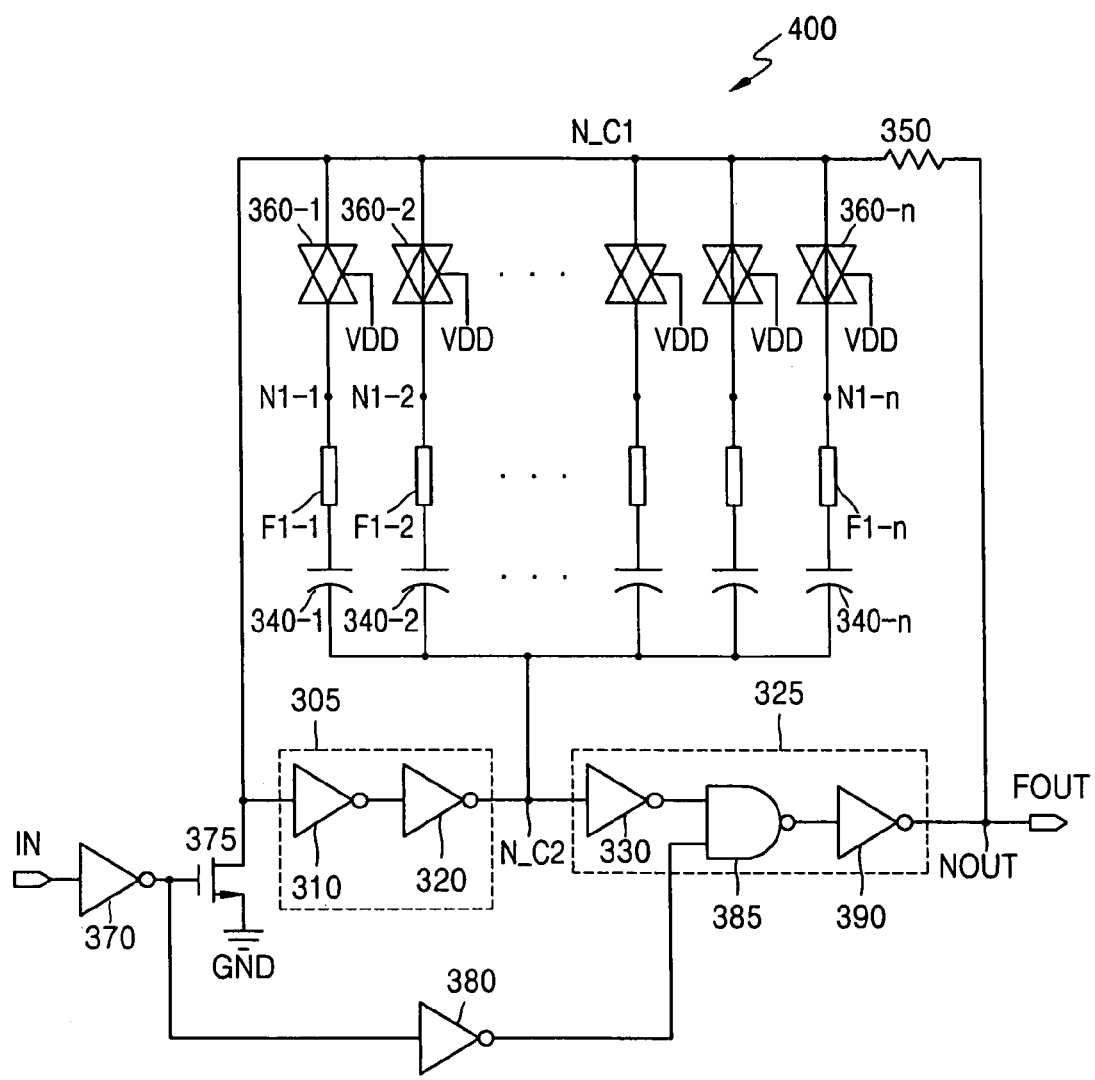
FIG. 4 is a circuit diagram of an RC oscillator circuit according to still another exemplary embodiment of the present invention.

FIG. 4 is a circuit diagram of an RC oscillator circuit 400 according to still another exemplary embodiment of the present invention. The RC oscillator circuit 400 shown in FIG. 4 has the same structure as the oscillation circuit 300 shown in FIG. 3, except that fuse circuits F1-1 through F1-n are respectively disposed between the transmission gates 360-1 through 360-n and capacitors 340-1 through 340-n of the oscillator circuit 300 of FIG. 3.

The RC oscillator circuit 400 shown in FIG. 4 can vary the frequency of a frequency signal FOUT by changing the number of resistors 360-1 through 360-n and capacitors 340-1 through 340-n to be connected between an input terminal N_C1 and an output terminal N_C2 using on-off operations of the fuse circuits F1-1 through F1-n.

The RC oscillator circuit 400 can also generate a frequency signal having a specific frequency as well as a frequency signal insensitive to changes in process, temperature, and voltage, through the operations described above with reference to FIG. 3. The RC oscillator circuit 400 operates in the same manner as the RC oscillator circuit 300 of FIG. 3, except for operations by the fuse circuits F1-1 through F1-n, and, therefore, detailed description of the common operations are omitted in the interests of clarity and simplicity.

As described above, an RC oscillator circuit including transmission gates, according to exemplary embodiments of the present invention, can generate a frequency signal insensitive to changes in manufacturing process, temperature, and voltage. The RC oscillator circuit, according to exemplary embodiments of the present invention, can generate a frequency signal with a specific frequency.

Although the exemplary embodiments of the present invention have been described with reference to the accompanying drawings for the purpose of illustration, it is to be understood that the inventive processes and apparatus are not to be construed as limited thereby. It will be readily apparent to those of ordinary skill in the art that various modifications to the foregoing exemplary embodiments may be made without departing from the scope of the invention as defined by the appended claims, with equivalents of the claims to be included therein.

What is claimed is:

1. A resistor-capacitor (RC) oscillator circuit comprising:
   a delay unit delaying and outputting a signal received through an input terminal;
   a resistor unit connected between an input terminal of the delay unit and a first node;
   a capacitor connected between an output terminal of the delay unit and the first node;
   a resistor connected to the input terminal of the delay unit and an output node; and
   a first controller connected between the output terminal of the delay unit and the output node,
   wherein a frequency signal is output through the output node.

2. The RC oscillator circuit of claim 1, wherein the delay unit includes first and second inverters serially connected and wherein a threshold voltage of the first inverter is about 1/2 of a supply voltage.

3. The RC oscillator circuit of claim 2, wherein propagation delay times of the first and second inverters are smaller than an RC time constant of the resistor and the capacitor.

4. The RC oscillator circuit of claim 1, wherein resistance of the resistor unit is inversely proportional to a voltage applied between the input terminal and the first node.

5. The RC oscillator circuit of claim 1, wherein resistance of the resistor unit is inversely proportional to a temperature of the resistor unit.

6. The RC oscillator circuit of claim 1, wherein a frequency of the frequency signal varies proportional to resistance of the resistor unit.

7. The RC oscillator circuit of claim 1, wherein the resistor unit is a transmission gate which is always in a turned-on state.

8. The RC oscillator circuit of claim 1, wherein a frequency of the frequency signal varies in response to a change in capacitance of the capacitor.

9. The RC oscillator circuit of claim 1, wherein a frequency of the frequency signal varies in response to a change in resistance of the resistor.

10. The RC oscillator circuit of claim 1, further comprising a fuse circuit disposed between the resistor unit and the capacitor.

11. The RC oscillator circuit of claim 1, wherein the first controller comprises:
    a third inverter connected to the output terminal of the delay unit;
    a NAND device performing a NAND operation of an output of the third inverter and a delay signal having a predetermined delay time; and
    a fourth inverter inverting and outputting an output of the NAND device as the frequency signal.

12. The RC oscillator circuit of claim 11, further comprising:
    a fifth inverter inverting and outputting an input signal;
    a transistor having a first terminal connected to the input terminal of the delay unit, a second terminal connected to a ground voltage, and a gate receiving an output of the fifth inverter; and
    a sixth inverter inverting and outputting the output of the fifth inverter as the delay signal.

13. A resistor-capacitor (RC) oscillator circuit, comprising:
    a delay unit delaying and outputting a signal received through an input terminal;
    a plurality of resistor units respectively connected in parallel between an input terminal of the delay unit and a plurality of corresponding first nodes;
    capacitors respectively connected in parallel between an output terminal of the delay unit and the corresponding first nodes;
    a resistor connected between the input terminal of the delay unit and an output node; and
    a first controller connected between the output terminal of the delay unit and the output node,
    wherein a frequency signal is output through the output node.

14. The RC oscillator circuit of claim 13, wherein the delay unit comprises first and second inverters serially connected and a threshold voltage of the first inverter is about 1/2 of a supply voltage.

15. The RC oscillator circuit of claim 14, wherein propagation delay times of the first and second inverters are smaller than an RC time constant of the resistor and the capacitor.

16. The RC oscillator circuit of claim 13, wherein the plurality of resistor units have resistance inversely proportional to a voltage applied between the input terminal and the corresponding first nodes.

17. The RC oscillator circuit of claim 13, wherein the plurality of resistor units have resistance inversely proportional to a temperature of the resistor units.

18. The RC oscillator circuit of claim 13, wherein a frequency of the frequency signal varies proportional to resistance of each of the plurality of resistor units.

19. The RC oscillator circuit of claim 13, wherein the plurality of resistor units are transmission gates which are always in a turned-on state.

20. The RC oscillator circuit of claim 13, wherein a frequency of the frequency signal varies in response to a change in capacitance of the plurality of capacitors.

21. The RC oscillator circuit of claim 13, wherein a frequency of the frequency signal varies in response to a change in resistance of the resistor.

22. The RC oscillator circuit of claim 13, wherein the first controller comprises:

a third inverter connected to the output terminal of the delay unit;

a NAND device performing a NAND operation of an output of the third inverter and a delay signal having a predetermined delay time; and a fourth inverter inverting and outputting an output of the NAND device as the frequency signal.

23. The RC oscillator circuit of claim 22, further comprising:

a fifth inverter inverting and outputting an input signal;

a transistor having a first terminal connected to the input terminal of the delay unit, a second terminal connected to a ground voltage, and a gate receiving an output of the fifth inverter; and a sixth inverter inverting and outputting the output of the fifth inverter as the delay signal.

24. The RC oscillator circuit of claim 13, wherein fuse circuits are respectively disposed between the plurality of resistor units and the respective corresponding capacitors.

* * * * *